US008754697B2

(12) United States Patent
Patrizi

(10) Patent No.: US 8,754,697 B2
(45) Date of Patent: Jun. 17, 2014

(54) HYBRID DUAL MODE FREQUENCY SYNTHESIZER CIRCUIT

(75) Inventor: Michael Robert Patrizi, Allen, TX (US)

(73) Assignee: Raytheon Company, Waltham, MA (US)

(*) Notice: Subject to any disclaimer, the term of this patent is extended or adjusted under 35 U.S.C. 154(b) by 57 days.

(21) Appl. No.: 13/476,822

(22) Filed: May 21, 2012

(65) Prior Publication Data

US 2013/0307605 A1    Nov. 21, 2013

(51) Int. Cl.
*H03K 3/00* (2006.01)
(52) U.S. Cl.
USPC .......................................... 327/298; 327/113
(58) Field of Classification Search
USPC ............ 327/105, 113–116, 291, 298; 455/71, 455/76; 331/34, 96; 342/174, 201; 708/271, 708/272
See application file for complete search history.

(56) References Cited

U.S. PATENT DOCUMENTS

| 6,005,446 | A  |   | 12/1999 | Galani et al. |
| 7,012,453 | B2 | * | 3/2006  | Coleman et al. ............. 327/113 |
| 7,606,849 | B2 |   | 10/2009 | Kushnick |
| 7,724,097 | B2 |   | 5/2010  | Carley et al. |
| 2010/0127788 | A1 |   | 5/2010 | Chan |
| 2011/0109395 | A1 | * | 5/2011 | Chindo ........................ 331/94.1 |

FOREIGN PATENT DOCUMENTS

WO    WO 2006/065031 A1    6/2006

OTHER PUBLICATIONS

Written Opinion of the International Searching Authority for International Application No. PCT/US2013/033553, filed Mar. 22, 2013, Written Opinion of the International Searching Authority mailed Aug. 1, 2013 (6 pgs.).
International Search Report for International Application No. PCT/US2013/033553, filed Mar. 22, 2013, International Search Report dated Jul. 10, 2013 and mailed Aug. 1, 2013 (3 pgs.).

* cited by examiner

*Primary Examiner* — Lincoln Donovan
*Assistant Examiner* — Diana J Cheng
(74) *Attorney, Agent, or Firm* — Christie, Parker & Hale, LLP

(57) ABSTRACT

A dual mode frequency synthesizer circuit including: a DDS or PLL (204) for receiving an input clock (202) and generating an output clock (206), in a high resolution mode; and an RF switch (210) having its output (208) coupled to the output of the DDS or PLL, a first input (216) for receiving a first injection low phase-noise clock (F1), a second input (218) for receiving a second injection low phase-noise clock (F2), and a control input (222) for selecting one of the first or second injection low phase-noise clocks for a low phase-noise mode.

12 Claims, 4 Drawing Sheets

HYBRID DUAL MODE FREQUENCY SYNTHESIZER CIRCUIT

FIELD OF THE INVENTION

The present invention relates to an electronic circuits and systems and more specifically to a hybrid dual-mode frequency synthesizer circuit.

BACKGROUND

A synthesizer creates a stable local oscillator (LO) to enable frequency conversion in radar/communication systems. By changing the frequency of the local oscillator, the system can tune across various frequencies. A key technical performance measure for frequency synthesizers is single-sideband phase-noise. Radar systems' detection and identification capability is directly proportional to the phase-noise performance of the LOs that are used for frequency conversion. The mechanism for tuning this LO signal resides within the synthesizer itself, an example of which is a direct digital synthesizer (DDS). The tuning mechanism within a frequency synthesizer degrades phase-noise performance based on the degree of tuning resolution. In other words, a higher degree of tuning (i.e., smaller step size) causes more degradation. When architecting a radar system, detection/identification capability often has to be sacrificed for frequency agility.

Synthesizers can be classified into 3 categories: phase-locked loop (PLL)-based, DDS-based, and mix-and-multiply. In terms of phase-noise performance, the latter two architectures provide the best phase-noise. DDS-based synthesizers offer high resolution with good residual phase-noise. A typical DDS is clocked with a high-frequency reference input, coupled with a numerically controlled oscillator (NCO) to generate a controlled frequency and phase output signal. The DDS output range is dictated by this NCO word. Generally, the output frequency can be tuned up to about 40% of the reference frequency. As an example, if a DDS can be clocked with up to a 2 GHz input reference, it is capable of an output up to about 800 MHz. In general, a (DDS) can provide very agile tunability, however the total phase-noise is degraded in a DDS. Therefore, a DDS-based synthesizer architecture will generate higher phase-noise when compared to a mix-and-multiply synthesizer architecture.

A mix-and-multiply synthesizer architecture may provide the best possible phase-noise performance, but it is prohibitively expensive and large to implement. A mix-and-multiply synthesizer generates discrete offset frequencies without using a DDS device, which therefore circumvents the additive phase-noise of the DDS completely. These synthesizers require multiple RF modules to generate, filter, and condition the frequency offsets that are switched across the desired radar band.

SUMMARY

In some embodiments, the present invention is a dual mode frequency synthesizer circuit, which includes a direct digital synthesizer (DDS) for receiving an input clock as input and generating an output clock as an output, in a high resolution mode; and an RF switch having an output coupled to the output of the DDS, a first input for receiving a first injection low phase-noise clock, a second input for receiving a second injection low phase-noise clock, and a control input for selecting one of the first or second injection low phase-noise clocks as the RF switch output for a low phase-noise mode, wherein the DDS is enabled, the RF switch is disabled and the output of the DDS is selected as the output of the dual mode frequency synthesize when the high resolution mode is activated, and wherein the DDS is disabled, the RF switch is enabled and one of the first or second injection low phase-noise clocks is selected as the output of the dual mode frequency synthesizer when the low phase-noise mode is activated.

In some embodiments, the present invention is a dual mode frequency synthesizer circuit, which includes a phase-locked loop (PLL) for receiving an input clock as input and generating an output clock as an output, in a high resolution mode; and an RF switch having an output coupled to the output of the PLL, a first input for receiving a first injection low phase-noise clock, a second input for receiving a second injection low phase-noise clock, and a control input for selecting one of the first or second injection low phase-noise clocks as the RF switch output for a low phase-noise mode, wherein the PLL is enabled, the RF switch is disabled and the output of the PLL is selected as the output of the dual mode frequency synthesize when the high resolution mode is activated, and wherein the PLL is disabled, the RF switch is enabled and one of the first or second injection low phase-noise clocks is selected as the output of the dual mode frequency synthesizer when the low phase-noise mode is activated.

In some embodiments, the present invention is a dual mode frequency synthesizer circuit, which includes a direct digital synthesizer (DDS) or a phase-locked loop (PLL) for receiving an input clock as input and generating an output clock as an output, in a high resolution mode; a first RF switch having an output, a first input coupled to the output of the DDS or PLL, a second input, and a control input for selecting one of the first or second inputs; a second RF switch having an output coupled to the second input of the first RF switch, a first input for receiving a first injection low phase-noise clock, a second input for receiving a second injection low phase-noise clock, and a control input for selecting one of the first or second injection low phase-noise clocks as the second RF switch output coupled to the second input of the first RF switch; a bandpass filter coupled to the output of the first RF switch; a multiplier coupled to the second injection low phase-noise clock; and a mixer coupled to an output of the bandpass filter and an output of the multiplier for outputting the output of the dual mode frequency synthesizer, wherein the DDS or PLL is enabled, the first RF switch is disabled and the output of the DDS or PLL is selected for input to the bandpass filter when the high resolution mode is activated, and wherein the DDS or PLL is disabled, the first RF switch is enabled and one of the first or second injection low phase-noise clocks is selected by the first and second RF switches for input to the bandpass filter when the low phase-noise mode is activated.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

Figure 1:
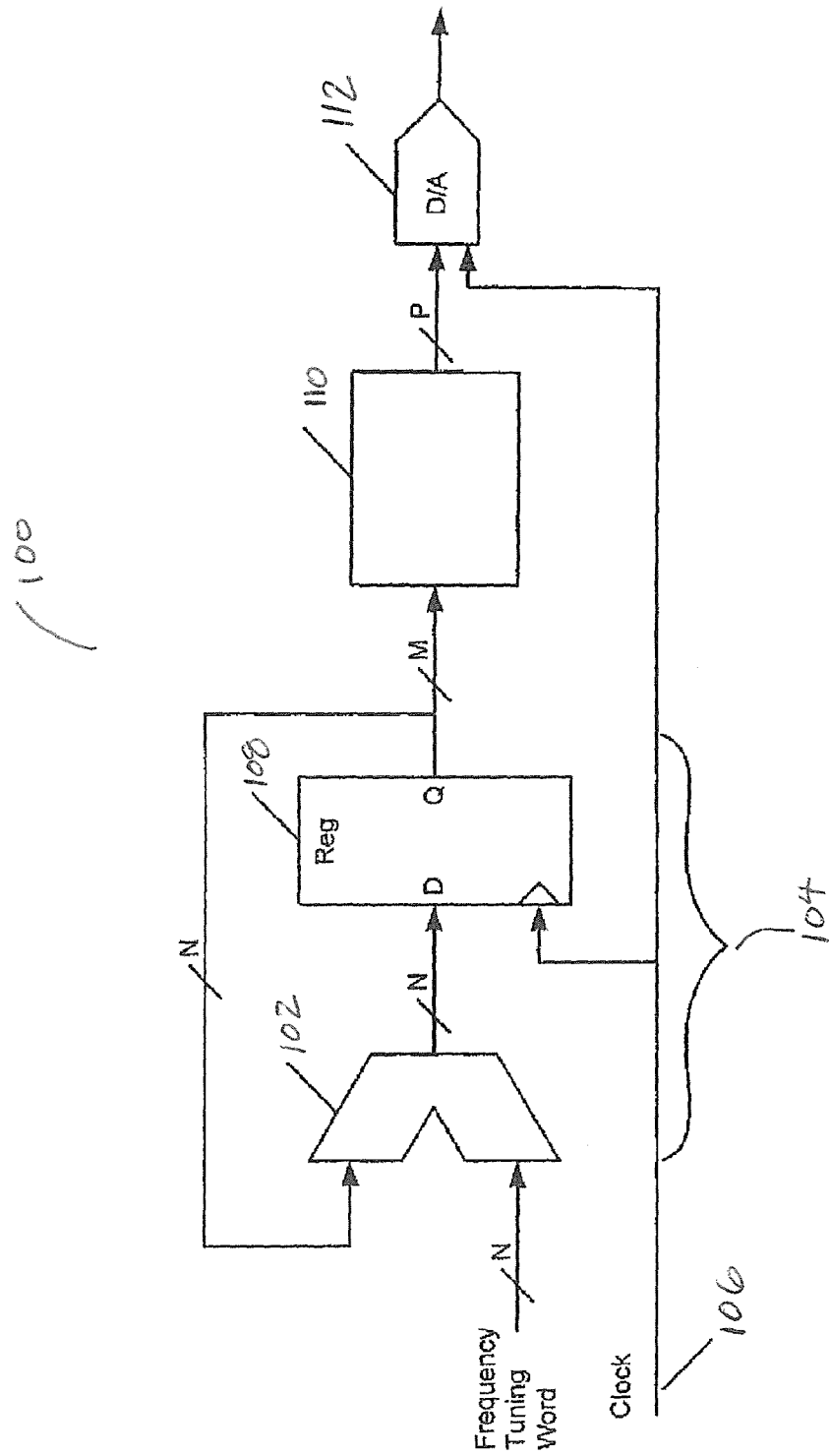
FIG. 1 is a block diagram of a conventional direct digital synthesizer.

The present invention will now be described more fully with reference to the accompanying drawings, in which exemplary embodiments thereof are shown. The invention may, however, be embodied in many different forms and should not be construed as being limited to the embodiments set forth herein. Rather, these embodiments are provided so that this disclosure is thorough and complete, and will fully convey the concept of the present invention to those skilled in the art.

In some embodiments, the present invention is a dual mode hybrid frequency synthesizer that fuses together the flexibility and size benefits of a DDS-based synthesizer with the lowest-noise performance of a mix-and-multiply-based synthesizer. The present invention incorporates additional RF circuitry that creates a synthesizer that can be operated in a DDS-mode (for high tunability) or mix-and-multiply-mode (for lowest phase-noise). The additional RF subsystem includes low-noise RF switches, signal routing, and a scheme, for example a software algorithm, to select the optimal mode of operation. The synthesizer of the present invention is capable of "injecting" high-performance frequency offsets into the signal path that is used for DDS output signals that serve to circumvent the additive phase-noise of the DDS, thereby producing superior phase-noise at these inject offsets.

In some embodiments, the present system is a dual mode hybrid frequency synthesizer (HFS) that is capable of operating in two different modes—a high-resolution tuning mode, or a low-phase-noise mode. The HFS architecture employs a digital synthesizer such as a direct digital synthesizer (DDS) or a phase lock loop (PLL)-based synthesizer that can tune with sub-Hertz frequency resolution and thus offering flexible tuning of the synthesized LO. In some embodiments, the HFS can circumvent the digital synthesizer (e.g., DDS) and directly inject offset frequencies that are not generated by the DDS. In some embodiments, these individual offset frequencies are generated via frequency multiplication and mixing and are therefore not subject to phase-noise degradation above the 20*log(N) theoretical limit.

The HFS of the present invention breaks the traditional synthesizer tradeoff of tunability vs. phase-noise performance by being able to operate in two different modes. Since the HFS is still digital synthesizer based (e.g., DDS-based), it can be implemented in a relatively small size, compared to current practices, to achieve both tunability and phase-noise. The injection feature of the HFS is one of the features of dual-mode operation. For example, if the HFS needs to tune across 500 MHz bandwidth, a DDS would provide the 500 MHz of tuning; however, discrete frequency channels at various points along this 500 MHz range can be injected into that same signal path via a switch, for example, programmable RF switch. The injection feature of the HFS is one of the features of dual-mode operation. For example, if the HFS needs to tune across 500 MHz bandwidth, a DDS would be programmed to provide frequency outputs across the 500 MHz of tuning; however, various discrete frequency channels within this range can be injected into the output signal path of the DDS via, for example, a 2-way RF switch. Since the DDS output is circumvented, the synthesizer output is not degraded by the residual phase noise of the DDS and is able to provide better phase noise frequency at that specific discrete output.

FIG. 1 is a block diagram of a conventional direct digital synthesizer 100. As shown, an N-bit frequency tuning word (FTW) is input to an adder 102 as part of a phase accumulator 104. The FTW input typically represents an incremental amount (phase increment) or degree of phase being advanced during each period of clock 106 for the waveform being generated. The adder 102 adds the total accumulated degree of phase and a register 108 stores it at each clock cycle. The accumulated degree of phase is then converted to a desired amplitude value by a phase-to-amplitude look up table 110 to generate the desired waveform. That is, the total accumulated degree of phase is used to address the lookup table 110. The (amplitude) output of the lookup table is then converted to an analog signal with the tuned frequency, by a digital-to-analog converter (D/A) 112. However the total phase-noise is degraded in a DDS when compared to generating the same output frequency by multiplying and/or mixing the original signal, due to the circuitry within the DDS (e.g., the D/A).

Figure 2:
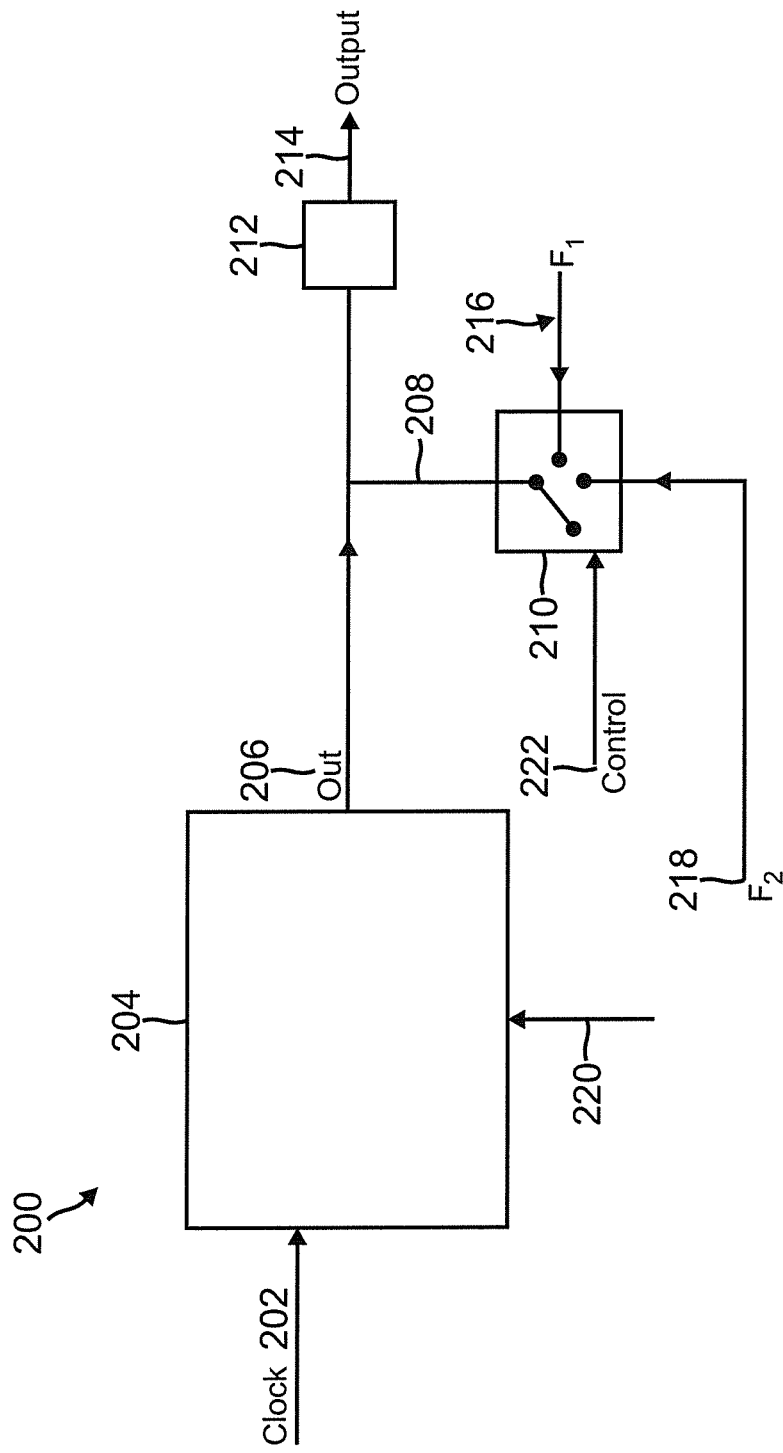
FIG. 2 is an exemplary block diagram of a hybrid frequency synthesizer (HFS), according to some embodiments of the present invention.

FIG. 2 is an exemplary block diagram of a hybrid frequency synthesizer (HFS) 200, according to some embodiments of the present invention. As shown, a conventional DDS or PLL 204 is used for a robust tunability of a clock input 202. The output of the DDS or PLL 204 is connected to the output 208 of an RF switch 210. The RF switch includes two clocks F1 216 and F2 218 as inputs. The F1 and F2 clocks can be generated (by dividers, multipliers, or a combination thereof) from the system's master clock. The RF switch 210 is controlled by a control signal 222 to inject the F1 or the F2 clocks into the output line of the synthesizer 204, depending on the system requirements and at the same time, disable the output of the synthesizer 204. For example, for a channel with relatively higher phase-noise requirement, the switch 210 is set to an "OFF" position and the output 206 of the synthesizer 204 is fed to a bandpass filter 212 before it is output 214. On the other hand, for a channel with relatively low phase-noise requirement, the switch 210 is set to an "ON" where the switch can selected F1 or a multiple of F1, or F2 or a multiple of F2 and injects the selected frequency 208 into the output path. The selected injected frequency is then filtered by the same bandpass filter 212 before it is outputted (214). Accordingly, the HFS of the present invention provides a switchable channel, in this case, using frequencies (F1 and F2) derived from mixing or multiplying of the existing system clocks.

Figure 3:
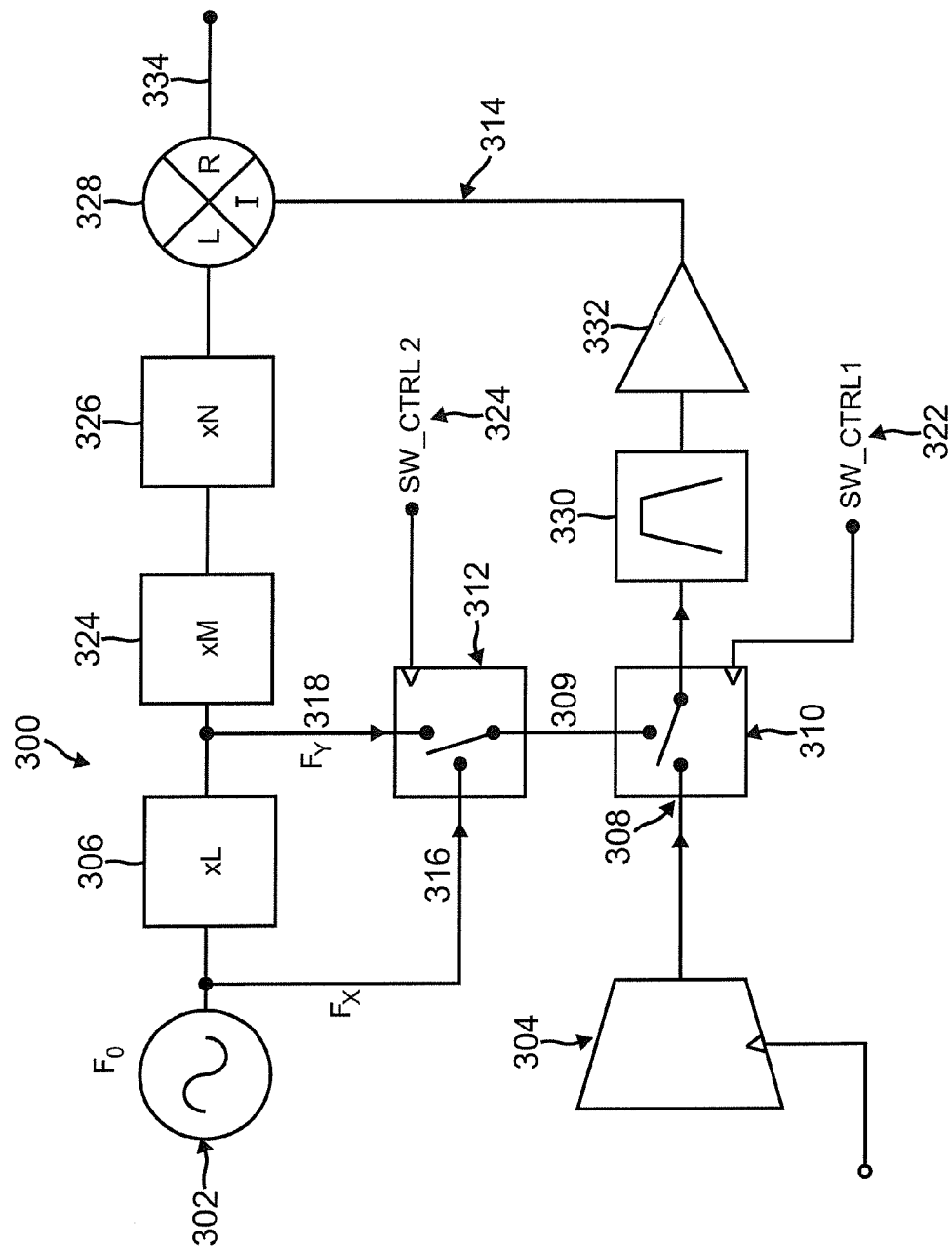
FIG. 3 is an exemplary block diagram of a hybrid frequency synthesizer (HFS) with multiple frequency injection mode, according to some embodiments of the present invention.

FIG. 3 is an exemplary block diagram of a hybrid frequency synthesizer (HFS) 300 with multiple frequency injection mode, according to some embodiments of the present invention. As shown, a conventional DDS or PLL 304 is used for a robust tunability of a clock input 302. The output of the DDS or PLL 304 is connected to port 1 (308) of a first RF switch 310. The other input port 309 of the first RF switch 310 is connected the output of a second RF switch 318. The first RF switch 310 is controlled by a first control signal SW-CTRL2 322 to output either the output of the DDS or PLL 304 or the output of the second RF switch 312, depending on the first control signal 322.

The second RF switch 312 includes two injection frequencies; Fx at the first input port 316 and Fy at the second input port 318, selected by a second control signal 324. The Fx and Fy clocks can be generated by dividers or multipliers from the system's master clock 302. In this case, Fy is generated by the multiplier 306, which multiplies the system's master clock 302 by L. Two optional multipliers or dividers 324 and 326 may further multiply or divide the system's master clock 302 by M and N, respectively, before it is fed to a mixer 328.

The block diagram in FIG. 3 provides an example for two low-noise injection frequencies (signals) Fx and Fy, however, the number of injecting signals can be increased to an arbitrary number. The first and second RF switches (310 & 312) are controlled by control signals 322 and 324, respectively to inject the Fx or the Fy signals into the output line of the synthesizer 304, depending on the system requirements and at the same time, disable the output of the synthesizer 304. DDS devices typically provide a "Disable Output" command and thus control signal 322 can be used to both command the RF switch 310 to select one of the two inputs and to disable the synthesizer 304. The two inputs of RF switch 310 select between either the DDS output or the low-noise injection frequencies Fx and Fy. The output of the first RF switch 310 is then fed to a low pass filter 330 and an amplifier 332 to condition the output signal. The filtered and amplified signal 314 is then fed to the mixer 328 to combine the output of the multiplier/divider 326 and the filtered and amplified signal 314 an output them as the desired signal 334.

As an example, for a master synthesizer reference input of $f_0$, FIG. 3 depicts injection frequencies of $Fx=f_0$ and $Fy=L*f_0$. At these two specific frequencies, the hybrid synthesizer achieve better phase-noise by bypassing the DDS 304 for outputs Fx and Fy and inject Fx and Fy into the tunable output signal 314. This example represents Fx and Fy being the two available high-performance injection frequencies and therefore all other frequency outputs of the hybrid synthesizer would use outputs generated by the DDS device 304. The algorithm to control the injection frequencies would be dependent on the specific implementation of each hybrid synthesizer. In this example, for channels residing at frequencies Fx or Fy, the DDS 304 would be disabled and RF switches (310 & 312) activated to select the high-performance mode, that is, the frequency injection mode.

Figure 4:
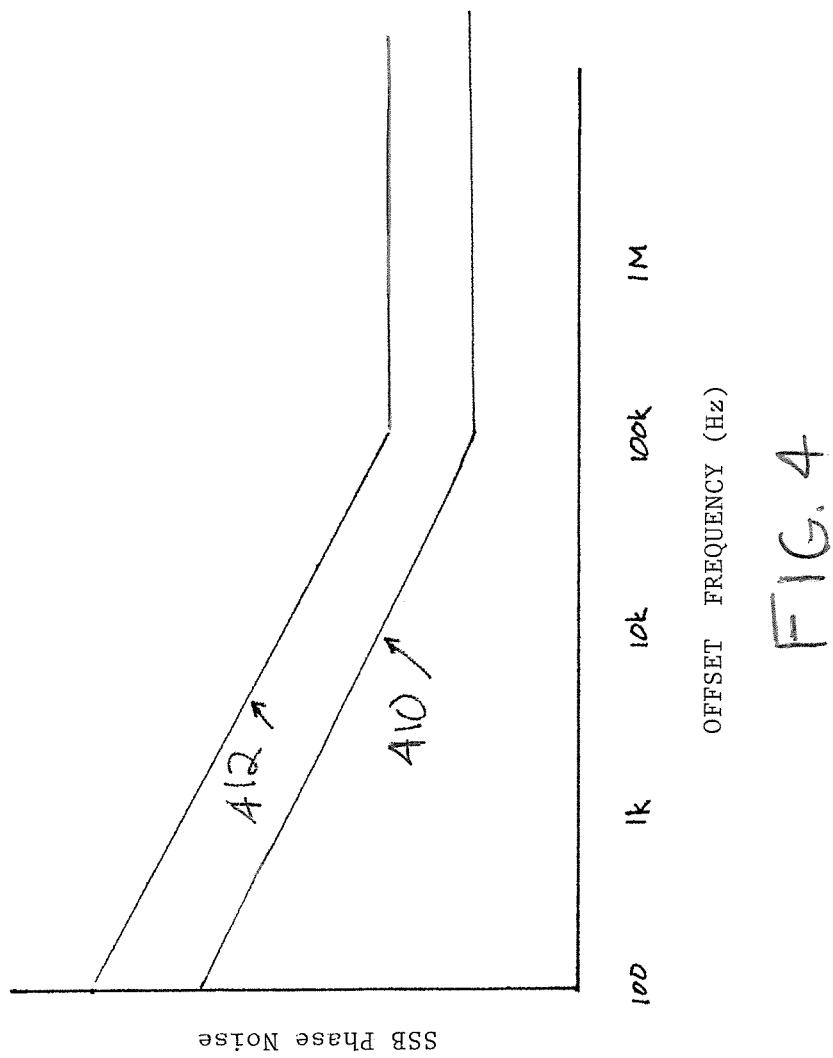
FIG. 4 is an exemplary block diagram of the phase-noise performance of a hybrid channel vs. that of a DDS-generated channel at the same frequency.

FIG. 4 is an example of single-sideband phase-noise of F1 for the cases when derived from the master reference (410) and derived using a DDS (412). As shown, the lower phase-noise is injected per description of FIG. 2 or FIG. 3, and results in lower total phase-noise at that specific frequency channel across the synthesizer output band. This is because the DDS 304 and therefore the phase-noise producing components (e.g., the D/A) of the DDS 304 are bypassed n the injection mode.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A dual mode frequency synthesizer circuit comprising:
a direct digital synthesizer (DDS) for receiving an input clock as input and generating an output clock as an output, in a high resolution mode; and
an RF switch having an output coupled to the output of the DDS, a first input for receiving a first injection low phase-noise clock, a second input for receiving a second injection low phase-noise clock, and a control input for selecting one of the first or second injection low phase-noise clocks as the RF switch output for a low phase-noise mode, wherein the second injection low phase-noise clock is generated from the first injection low phase noise clock by a divider, wherein
the DDS is enabled, the RF switch is disabled and the output of the DDS is selected as the output of the dual mode frequency synthesize when the high resolution mode is activated, and wherein
the DDS is disabled, the RF switch is enabled and one of the first or second injection low phase-noise clocks is selected as the output of the dual mode frequency synthesizer when the low phase-noise mode is activated.

2. The dual mode frequency synthesizer circuit of claim 1, wherein the second injection low phase-noise clock is generated from the first injection low phase noise clock by a multiplier.

3. The dual mode frequency synthesizer circuit of claim 1, wherein the first and second injection low phase-noise clock are generated from the input clock by multipliers or dividers.

4. The dual mode frequency synthesizer circuit of claim 1, further comprising a bandpass filter to filter the output of the dual mode frequency synthesize.

5. The dual mode frequency synthesizer circuit of claim 1, further comprising a second RF switch having an output coupled to the first input of the first RF switch, a first input for receiving a third injection low phase-noise clock, a second input for receiving a fourth injection low phase-noise clock, and a control input for selecting one of the third or fourth injection low phase-noise clocks as the second RF switch output for a low phase-noise Mode.

6. The dual mode frequency synthesizer circuit of claim 1, wherein the fourth injection low phase-noise clock is generated from the third injection low phase noise clock by a multiplier or divider.

7. A dual mode frequency synthesizer circuit comprising:
a phase-locked loop (PLL) for receiving an input clock as input and generating an output clock as an output, in a high resolution mode; and
an RF switch having an output coupled to the output of the PLL, a first input for receiving a first injection low phase-noise clock, a second input for receiving a second injection low phase-noise clock, and a control input for selecting one of the first or second injection low phase-noise clocks as the RF switch output for a low phase-noise mode, wherein the second injection low phase-noise clock is generated from the first injection low phase noise clock by a divide, wherein
the PLL is enabled, the RF switch is disabled and the output of the PLL is selected as the output of the dual mode frequency synthesize when the high resolution mode is activated, and wherein
the PLL is disabled, the RF switch is enabled and one of the first or second injection low phase-noise clocks is selected as the output of the dual mode frequency synthesizer when the low phase-noise mode is activated.

8. The dual mode frequency synthesizer circuit of claim 7, wherein the second injection low phase-noise clock is generated from the first injection low phase noise clock by a multiplier.

9. The dual mode frequency synthesizer circuit of claim 7, wherein the first and second injection low phase-noise clock are generated from the input clock by multipliers or dividers.

10. The dual mode frequency synthesizer circuit of claim 7, further comprising a bandpass filter to filter the output of the dual mode frequency synthesize.

11. The dual mode frequency synthesizer circuit of claim 7, further comprising a second RF switch having an output coupled to the first input of the first RF switch, a first input for receiving a third injection low phase-noise clock, a second input for receiving a fourth injection low phase-noise clock, and a control input for selecting one of the third or fourth injection low phase-noise clocks as the second RF switch output for a low phase-noise mode.

12. The dual mode frequency synthesizer circuit of claim 7, wherein the fourth injection low phase-noise clock is generated from the third injection low phase noise clock by a multiplier or divider.

* * * * *